(12) United States Patent
Ye et al.

(10) Patent No.: US 9,979,394 B2
(45) Date of Patent: May 22, 2018

(54) PULSE-GENERATOR

(71) Applicant: QUALCOMM Incorporated, San Diego, CA (US)

(72) Inventors: Qi Ye, San Diego, CA (US); Animesh Datta, San Diego, CA (US); Venkatasubramanian Narayanan, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/044,988

(22) Filed: Feb. 16, 2016

(65) Prior Publication Data

US 2017/0237434 A1 Aug. 17, 2017

(51) Int. Cl.
*H03K 3/356* (2006.01)
*H03K 19/003* (2006.01)
*H03K 3/037* (2006.01)
*H03K 3/033* (2006.01)
*H03K 5/04* (2006.01)

(52) U.S. Cl.
CPC ....... *H03K 19/00384* (2013.01); *H03K 3/033* (2013.01); *H03K 3/0375* (2013.01); *H03K 5/04* (2013.01)

(58) Field of Classification Search
CPC .............. H03K 3/0375; H03K 19/00384
USPC ........................................................ 327/211
See application file for complete search history.

(56) References Cited

U.S. PATENT DOCUMENTS

| 4,659,316 A | 4/1987 | Ozaki |
| 4,768,167 A | 8/1988 | Yoder |
| 5,072,132 A | 12/1991 | Samaras et al. |
| 5,173,870 A | 12/1992 | Sukashita et al. |
| 5,309,034 A * | 5/1994 | Ishibashi ................ H03K 3/033 327/172 |

(Continued)

FOREIGN PATENT DOCUMENTS

| EP | 0401865 A2 | 12/1990 |
| EP | 0459696 A2 | 12/1991 |

(Continued)

OTHER PUBLICATIONS

Partial International Search Report and Written Opinion—PCT/US2017/015565—ISA/EPO—dated Apr. 11, 2017.

(Continued)

*Primary Examiner* — Ryan Jager
(74) *Attorney, Agent, or Firm* — Arent Fox, LLP and Qualcomm, Incorporated

(57) ABSTRACT

The apparatus may include a first latch configured to store a first state or a second state. The first latch may have a first latch input, one of a set input or a reset input, a first pulse clock input, and a first latch output. The first latch input may be coupled to a fixed logic value. The one of the set input or the reset input may be coupled to a clock signal or an inverted clock signal, respectively. The apparatus may include an AND gate having a first AND gate input, a second AND gate input, and a first AND gate output. The clock signal may be coupled to the first AND gate input. The first latch output may be coupled to the second AND gate input. The AND gate output may be configured to output a pulsed clock. The pulsed clock may be coupled to the first pulse clock input.

16 Claims, 10 Drawing Sheets

(56) References Cited

U.S. PATENT DOCUMENTS

| | | | |
|---|---|---|---|
| 5,557,225 A * | 9/1996 | Denham | H03K 3/037 |
| | | | 327/172 |
| 5,764,089 A | 6/1998 | Partovi et al. | |
| 5,825,225 A | 10/1998 | Sugisawa et al. | |
| 5,883,529 A * | 3/1999 | Kumata | G06F 1/06 |
| | | | 326/83 |
| 5,886,529 A | 3/1999 | Wakamatsu | |
| 6,326,829 B1 * | 12/2001 | Naffziger | H03K 3/356156 |
| | | | 327/175 |
| 6,456,115 B2 * | 9/2002 | Li | H03K 19/0963 |
| | | | 326/113 |
| 6,597,223 B2 | 7/2003 | Vangal et al. | |
| 6,701,339 B2 | 3/2004 | Vangal et al. | |
| 6,879,201 B1 | 4/2005 | Chan | |
| 6,937,079 B1 | 8/2005 | Zhao et al. | |
| 7,042,267 B1 | 5/2006 | Pasqualini | |
| 7,046,066 B2 | 5/2006 | Saado et al. | |
| 7,068,080 B1 * | 6/2006 | Sanders | H03K 3/037 |
| | | | 326/93 |
| 7,154,319 B2 * | 12/2006 | Kim | H03K 3/356121 |
| | | | 327/202 |
| 7,180,350 B2 | 2/2007 | Hsieh et al. | |
| 7,180,351 B2 | 2/2007 | Hsieh et al. | |
| 7,256,621 B2 | 8/2007 | Lih et al. | |
| 7,492,203 B2 * | 2/2009 | Kim | H03K 3/012 |
| | | | 326/95 |
| 7,525,361 B2 | 4/2009 | Kim | |
| 7,667,500 B1 | 2/2010 | Alfke | |
| 7,724,058 B2 * | 5/2010 | Saint-Laurent | H03K 3/037 |
| | | | 327/172 |
| 8,013,654 B1 | 9/2011 | Chen et al. | |
| 8,030,982 B2 * | 10/2011 | Datta | H03K 3/356086 |
| | | | 327/211 |
| 8,222,921 B2 | 7/2012 | Lewis et al. | |
| 8,253,463 B1 * | 8/2012 | Chromczak | H03K 3/017 |
| | | | 327/172 |
| 8,427,213 B2 | 4/2013 | Lewis et al. | |
| 9,270,270 B2 * | 2/2016 | Cai | H03K 3/356052 |
| 2001/0008488 A1 | 7/2001 | Shinozaki | |
| 2006/0139084 A1 | 6/2006 | Kim et al. | |
| 2006/0181322 A1 | 8/2006 | Kim et al. | |
| 2007/0075738 A1 | 4/2007 | Hamada et al. | |
| 2007/0236253 A1 | 10/2007 | Tachibana et al. | |
| 2009/0058463 A1 | 3/2009 | Saint-Laurent et al. | |
| 2009/0154267 A1 | 6/2009 | Kang | |
| 2013/0033292 A1 * | 2/2013 | Hamdan | H03K 3/012 |
| | | | 327/142 |
| 2013/0328601 A1 | 12/2013 | Geisler et al. | |
| 2016/0344374 A1 * | 11/2016 | Ye | H03K 3/0375 |

FOREIGN PATENT DOCUMENTS

| | | |
|---|---|---|
| JP | 62188515 | 8/1987 |
| JP | 2235434 A | 9/1990 |
| JP | H03272216 A | 12/1991 |
| JP | 9205360 A | 8/1997 |
| JP | H09232919 A | 9/1997 |
| JP | 10190416 A | 7/1998 |
| JP | 10276069 A | 10/1998 |
| JP | 10512112 | 11/1998 |
| JP | 2003133916 A | 5/2003 |
| JP | 2003173361 A | 6/2003 |
| JP | 2007053680 A | 3/2007 |
| JP | 2007281756 A | 10/2007 |
| WO | 9621272 A1 | 7/1996 |
| WO | 96021272 | 7/1996 |

OTHER PUBLICATIONS

International Search Report and Written Opinion—PCT/US2017/015565—ISA/EPO—dated Jun. 7, 2017.

* cited by examiner

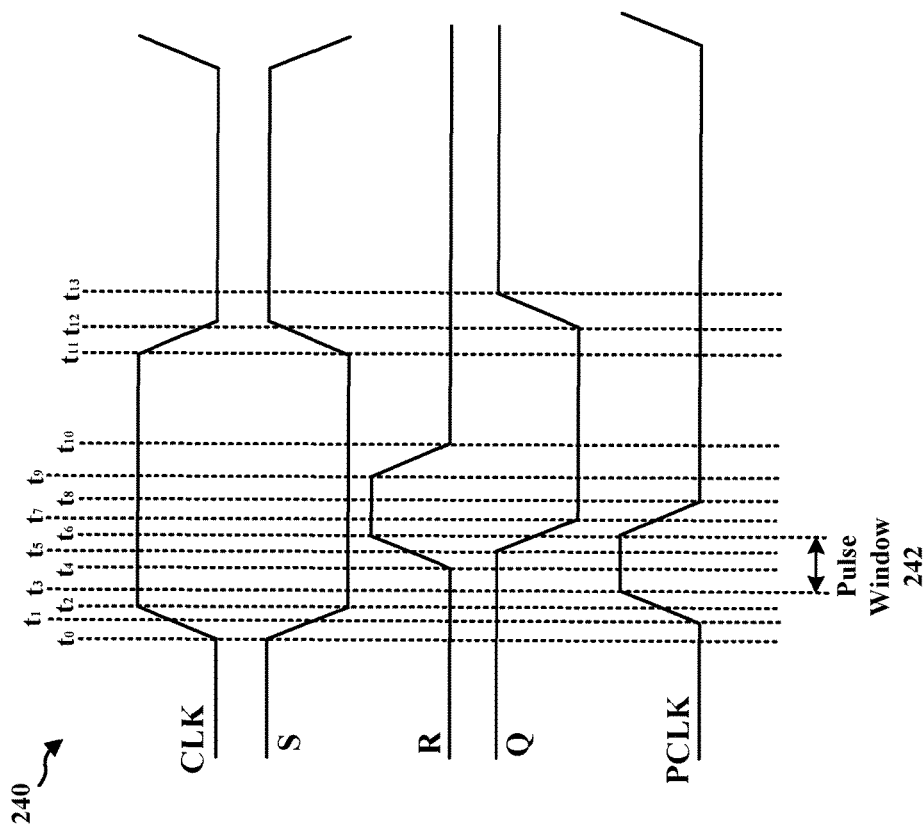
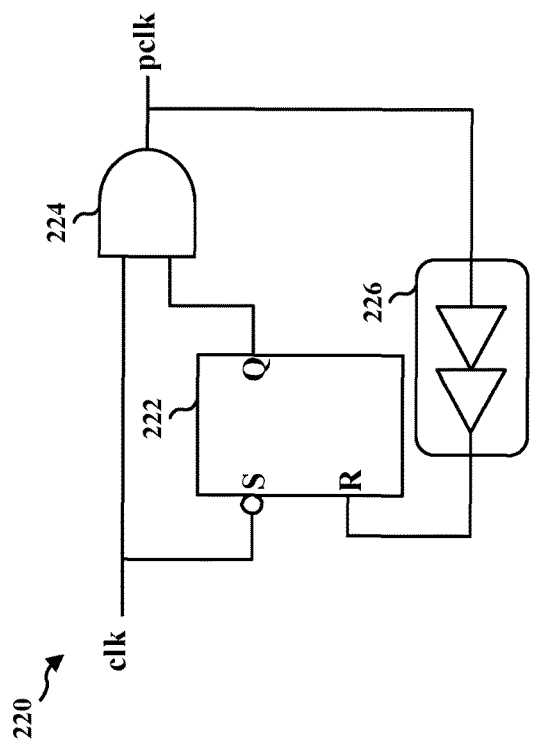
FIG. 2B
FIG. 2A

PULSE-GENERATOR

BACKGROUND

Field

The present disclosure relates generally to pulse generator circuitry, and more particularly, to pulse generator circuitry that may have better scaling across process, voltage, and temperature.

Background

In some examples, a pulse latch is an active-high latch clocked by a narrow pulse. The narrow pulse may be generated from the rising edge of a clock. A pulse-latch may provide substantial performance and clock power benefit compared to regular flip-flops. However, pulse-latches may be difficult to design. Additionally, pulse-latches may have a poor yield in some process technologies. One aspect of pulse latch designs is the control of the pulse-width used to clock the pulse latch. The pulse-width may impact the ability of the pulse latches to be written, which may be referred to as "write-ability."

In current pulse generator ("pulser") designs, pulse width and functional latch write path delay do not scale in the same way across process, voltage, and temperature (PVT). Because pulse width and functional latch write path delay do not scale in the same way in current pulse generator designs across PVT, extra buffers in the pulse generator delay path may be added to ensure that latches are able to be written for all cases. The extra buffers result in higher hold-time, clock power, and area for the circuitry, however.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

As described above, in current pulse generator designs, pulse width and functional latch write path delay do not scale in the same way across PVT. Control of the pulse-width used to clock a latch may provide for good yield without requiring excessive hold buffers or hold time overhead. Control of the pulse-width used to clock a latch may provide for good yield without requiring excessive hold buffers or hold time overhead by ensuring a wide enough pulse to clock the latch.

In an aspect of the disclosure, a method and an apparatus are provided. The apparatus may include a first latch configured to store a first state or a second state. The first latch may have a first latch input, one of a set input or a reset input, a first pulse clock input, and a first latch output. The first latch input may be coupled to a fixed logic value. The one of the set input or the reset input may be coupled to a clock signal or an inverted clock signal, respectively. The apparatus may include an AND gate having a first AND gate input, a second AND gate input, and a first AND gate output. The clock signal may be coupled to the first AND gate input. The first latch output may be coupled to the second AND gate input. The AND gate output may be configured to output a pulsed clock. The pulsed clock may be coupled to the first pulse clock input.

In another aspect of the disclosure, a method and an apparatus are provided. The apparatus may be configured to generate a rising edge of a pulse based on a rising edge of a clock signal. The apparatus may be further configured to maintain the pulse as a high logic value based on a propagation of a signal through a circuit; wherein the circuit is a type of circuit that is being clocked by the pulse.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 2A is a diagram illustrating a pulse generator.

FIG. 2B is a diagram illustrating a functional timing diagram of the pulse generator of FIG. 2A.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Figure 1:
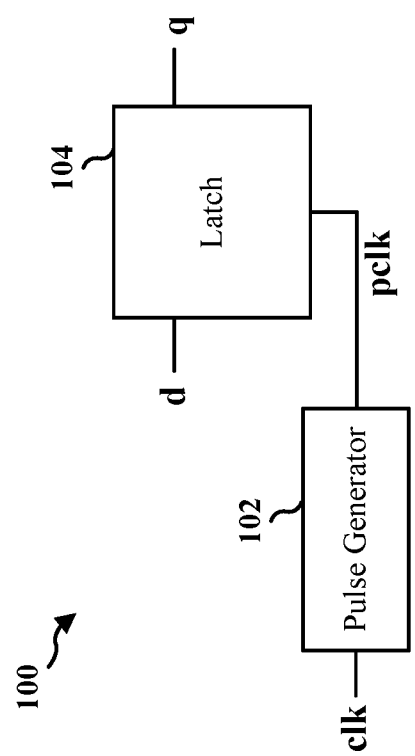
FIG. 1 is a diagram illustrating a pulse latch.

FIG. 1 is a diagram illustrating a pulse latch 100. As shown in FIG. 1, a pulse latch 100 includes a latch 104 and a pulse generator 102 for driving the latch 104. The pulse generator 102 receives a clock (clk) input and outputs a pulse clock (pclk) to the latch 104. When pclk goes from high to low, the latch 104 is configured to output a latched state q, and to latch/store a new input state d. The pulse window of pclk should be sufficiently wide to allow for state d to be received as input during the pulse window. However, if the pulse window is too wide, the latch will need a large hold time for holding the state d until pclk goes low.

FIG. 2A is a diagram illustrating a pulse generator 220. The pulse generator 220 of FIG. 2A may be used as the pulse generator 102 of FIG. 1. (Other pulse generators, such as those described below with respect to FIGS. 3, 5, 6, and 8 may be used as the pulse generator 102 of FIG. 1.) The pulse generator 220 includes a set-reset (SR) latch 222, an AND gate 224, and a delay module 226. The SR latch 222 has an inverted set (S) input, a reset (R) input, and an output (Q). An example SR latch truth table is illustrated below:

| S | R | $Q_{next}$ | Action |
|---|---|---|---|
| 0 | 0 | Q | hold state |
| 0 | 1 | 0 | reset |
| 1 | 0 | 1 | set |
| 1 | 1 | X | not allowed |

A clock (clk) is input to the inverted set (S) input and the AND gate 224. The output (Q) is also input to the AND gate 224. The AND gate 224 generates pclk, which is input to the delay module 226. The delay module 226 may include one or more delay cells, such as buffers connected in series, or specifically, an even number of inverters connected in series. An output of the delay module 226 is connected to the reset (R) input.

FIG. 2B is a diagram illustrating a functional timing diagram 240 of the pulse generator 220 of FIG. 2A. As shown in FIG. 2B, before t0, the clock (clk) is low, the set (S) input is high, and the output (Q) is high. As such, the pulse clock (pclk) is low and the reset (R) input is low. At t0, the clock (clk) starts to go high, causing the set (S) input to go low. At t1, the pulse clock (pclk) then starts to go high as the clock (clk) propagates through the AND gate 224. At t2, the clock (clk) is high and the set (S) input is low. At t3, the pulse clock (pclk) is also high. At t4, the pulse clock (pclk) propagates through the delay module 226, causing the reset (R) input to start to go high. At t5, the reset (R) input causes the output (Q) to start to go low. At t6, the reset (R) input is high and, as a result of the output (Q) going low, the pulse clock (pclk) starts to go low. At t7, the output (Q) is low. At t8, the pulse clock (pclk) is low. At t9, the pulse clock (pclk) propagates through the delay module 226, causing the reset (R) input to start to go low. At t10, the reset (R) input is low. At t11, the clock (clk) starts to go low, causing the set (S) input to go high, and thereafter at t12, the rising set (S) input causes the output (Q) to start to go high. At t13, the states are the same as before t0, with the clock (clk) low, the set (S) input high, the output (Q) high, the pulse clock (pclk) low, and the reset (R) input low. The pulse window 242 of the pulse clock (pclk) is shown between t3 and t6. The time between t1 (rising edge of the pulse clock (pclk)) and t4 (rising edge of the reset (R) input) determines a width of the pulse window 242. As such, by adjusting the delay through the delay module 226, a width of the pulse window 242 may be adjusted.

For the pulse generator circuit 220 of FIG. 2A, the delay cells, and the SR latch delay scaling may not track with functional latch write-path across PVT. In other words, the pulse generator circuit 220 of FIG. 2A may not function the same way for variations in process, voltage, or temperature. Additionally, the SR latch 222 is not synchronized to pulse clock (pclk), which is used by the functional latches in the design, e.g., the latch 104 (or other latches driven by pclk). Accordingly, variations in timing between the SR latch 222 and the pulse clock (pclk) may occur. These variations may impact the pulse width. If the pulse width of pulse clock (pclk) is too small (e.g., the pulse width of pclk is less than what is required to guarantee a successful write into a functional latch and/or allow for data propagation delay inside the functional latch) the latch 104 of FIG. 1 may not function properly. Thus, if the pulse generator circuit 220 of FIG. 2A is used as a pulse generator for latch 104 the latch 104 of FIG. 1 may not function properly. To ensure that a latch 104 receives a pulse clock (pclk) signal that has an acceptable pulse width, the added buffers of the delay module 226 may be used, as described above. Use of the delay module 226 will generally result in higher hold-time, higher clock power, and increased area usage, however. Accordingly, other pulse generators, such as those described below with respect to FIGS. 3, 5, 6, and 8 may be used as the pulse generator 102 of FIG. 1.

Figure 3:
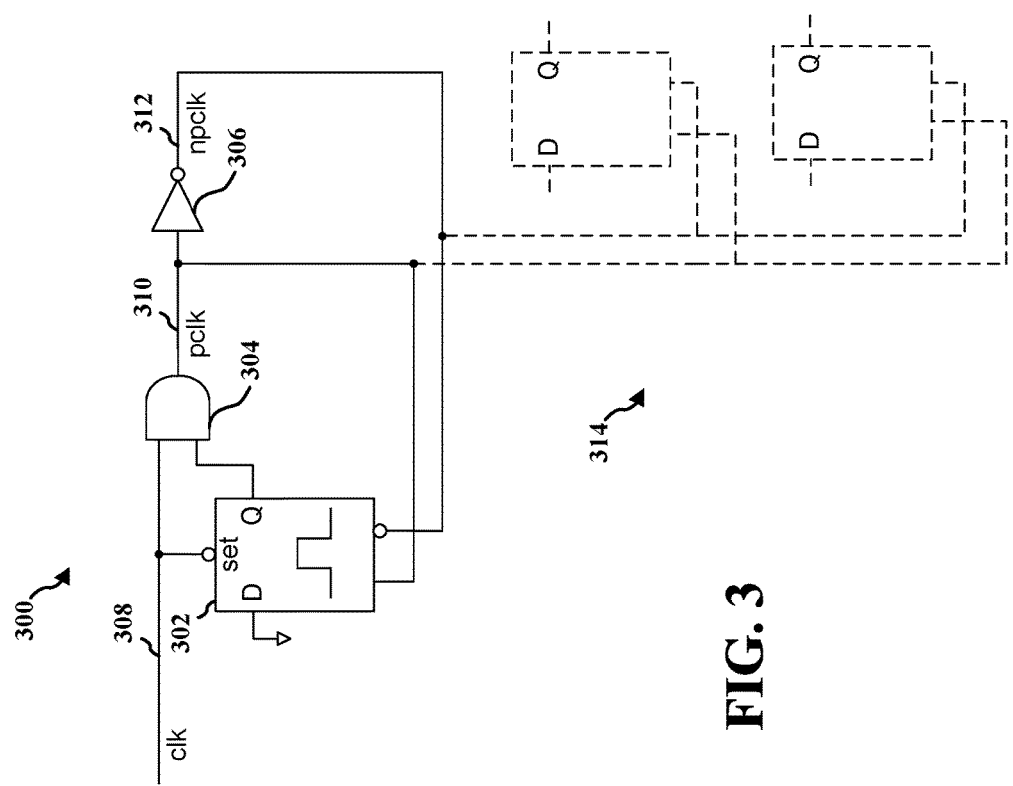
FIG. 3 is a circuit diagram illustrating an example of a pulse generator circuit in accordance with the systems and methods described herein.

FIG. 3 is a circuit diagram illustrating an example of a pulse generator circuit 300 in accordance with the systems and methods described herein. In the illustrated example of FIG. 3, a D latch 302 is used in place of the SR latch 102 used in the design of FIG. 1. More specifically, the pulse generator circuit 300 includes the D latch 302, an AND gate 304, and an inverter 306. The D latch 302 is driven by a pclk signal 310 and an npclk signal 312. The pclk signal 310 and the npclk signal 312 are generally the inverse of each other, e.g., the pclk signal 310 is an input of inverter 306 and the npclk signal 312 is an output of the inverter 306. Additionally, the pclk signal 310 and the npclk signal 312 may generally be the same pclk signal 310 and the same npclk signal 312 that are used to drive other D latches 314 used in the design, e.g., such as the functional latch 104 as illustrated in FIG. 1. (The other D latches 314 used in the design illustrated in FIG. 3 are not part of the pulse generator circuit 300, but rather, are circuits that may be clocked using the pulses generated by pulse generator circuit 300.) In the example of FIG. 3, the actual write path of the D latch is tied to ground, i.e., D=0. Accordingly, the D latch 302 models a "write-zero" operation, and can be referred to as a "write-zero" D latch.

In operation, in an initial state, the clock (CLK) signal 308 is low. The pclk (PCLK) signal 310 is low in this initial state because a low value on either input of the AND gate 304 will cause the output of the AND gate 304 to be low. In the initial state, set is active because it is an active low signal (in this example). As illustrated in FIG. 3, the clock signal 308 drives the set input of the D latch 314. With set active, the Q output of the D latch 302 is a logic high.

When the clock signal 308 rises, the set signal is no longer active. The Q output of the D latch 302 remains high (until clocked low). Accordingly, as the clock signal 308 rises, the pclk signal 310 also rises (delayed by some amount through the AND gate 304). Additionally, the npclk signal 312 falls to a low value (after some delay through the inverter 306).

The rising edge of the pclk signal 310 and the falling edge of the npclk signal 312 clock the low value on the D input, which is tied low, into the D latch 302. Accordingly, the Q output of the D latch 302 falls to a low value. Accordingly, as the Q output falls, the pclk signal 310 also falls (delayed by some amount through the AND gate 304). Additionally, the npclk signal 312 rises to a high value (after some delay through the inverter 306).

When the clock signal 308 falls, the D latch 302 is set. With the Q output of the D latch 302 high and the clock signal low, the pclk signal 310 is low and the npclk signal 312 is high. The pulse generator circuit 300 is back in its initial state.

As described above, the pulse generator circuit 300 of FIG. 3 may generate a pulse signal (pclk 310) based on a clock signal 308. The pulse signal is initially low and rises with the rising edge of the clock signal 308 (plus any delay through the AND gate 304). The pulse signal falls based on the D input of the D latch 302, which is tied low. The D input of the D latch 302 is tied low. After the clock signal 308 rises, the D input of the D latch 302 (a low value) may be clocked into the D latch 302. This occurs on the edges of the pclk 310 and npclk signals 312. Accordingly, the pulse width (pwidth) is at least as long as the time needed for the low value to propagate through the D latch 302.

For the pulse generator circuit 300 of FIG. 3, the pulse width is based on the timing through the D latch 302 of a write-zero operation. Any global shift in timing of the signals through the circuitry due to PVT (e.g., caused by weak PMOS/NMOS transistors) will be tracked in the pulse generator circuit 300 to adjust the pulse-width proportionately because the pulse generator circuit 300 uses the same type of latch (a D latch in the current example), clocked by the same pulses (pclk/npclk) as the functional latches in the device use (e.g., D latch 302/other D latches 314). Accordingly, the proper setup and hold times for the other D latches 314 can generally be guaranteed because the other D latches 314 are the same type of latch, may use the same type of process technology, and may generally be operating at the same or similar temperatures, as the D latch 302.

Additionally, the pulse generator circuit 300 accurately mimics the write-zero operation of the functional latch for the clock (pclk) to output (Q) path (clk2q path) because the D input is tied low. Accordingly, the pulse generator circuit 300 always models a write-zero operation. (FIGS. 6-7 relate to a "write-one" operation and FIGS. 8-9 cover both the write-zero operation and write-one operation.) Furthermore, a variation of the clock drivers will be compensated for using the design of FIG. 3 because the pulse width of the pulses is primarily set by the D latch 302 rather than the Boolean logic, e.g., the AND gate 304 and the inverter 306.

As discussed above, to ensure that the latch 104 of FIG. 1 receives a pulse clock (pclk) signal that has an acceptable pulse width, the pulse generator 220 of FIG. 2A uses the added buffers of the delay module 226. Use of the delay module 226 will generally result in higher hold-time, higher clock power, and increased area usage, however. The pulse generator circuit 300 of FIG. 3 does not generally need a delay module. Rather, the pulse generator circuit 300 of FIG. 3 generally ensures that the pulse width is acceptable because, in an example, the pulses for pclk and npclk are generated using the same type of latch (D latch) clocked by the same signals, i.e., the actual pclk and npclk signals, as will be used to clock the functional latches (e.g., the latch 104 of FIG. 1 and the other D latches 314 of FIG. 3).

Figure 4:
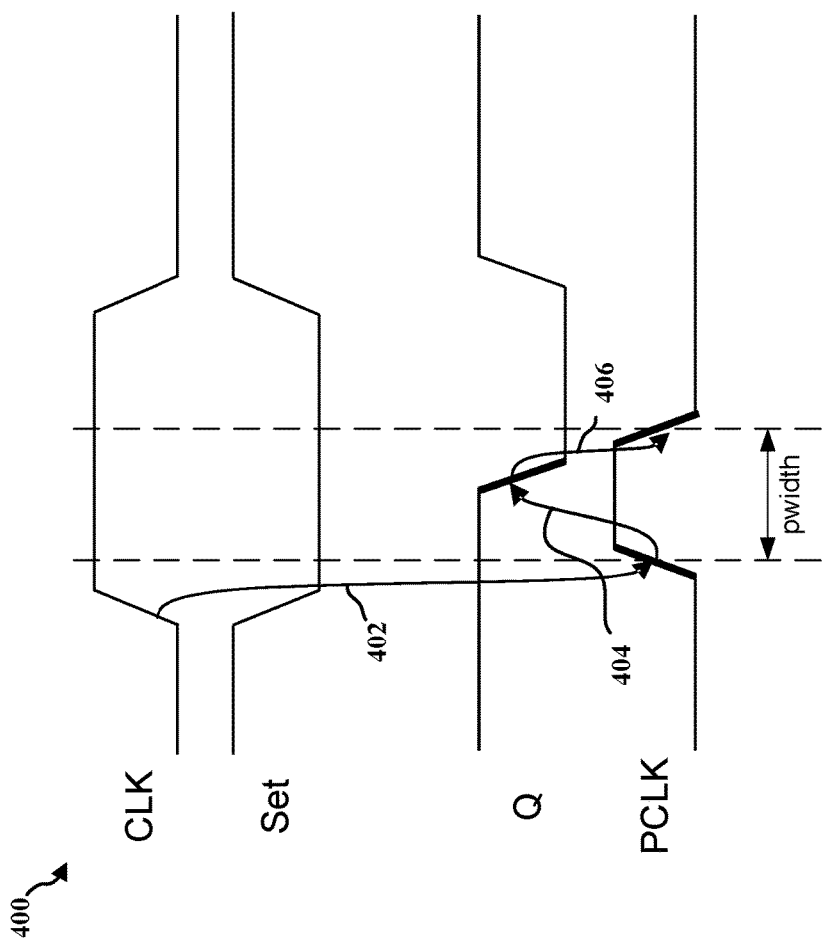
FIG. 4 is a timing diagram illustrating an example of signal timing related to the pulse generator circuit of FIG. 3.

FIG. 4 is a timing diagram 400 illustrating an example of signal timing related to the pulse generator circuit of FIG. 3. In an initial state, the CLK signal is low (clock signal 308). The PCLK signal (pclk 310) is low in this initial state because a low value on either input of the AND gate 304 will cause the output of the AND gate 304 to be low. In the initial state, SET is active because it is an active low signal (in this example). The CLK signal drives the set input of the D latch 314. With set active, the Q output of the D latch 302 is a logic high.

When the CLK signal rises, the SET signal is no longer active. The Q output of the D latch 302 remains high (until clocked low). Accordingly, as the CLK signal rises, the pclk signal 310 also rises (delayed by some amount through the AND gate 304) as indicated by the arrow 402. Additionally, the npclk signal 312 (not shown), which is the inverse of the pclk signal 310/PCLK falls to a low value (after some delay through the inverter 306).

The rising edge of the PCLK signal and the falling edge of the npclk signal 312 clock the low value on the D input, which is tied low, into the D latch 302. Accordingly, the Q output of the D latch 302 falls to a low value based on the rising edge of the PCLK signal as indicated by the arrow 404. As the Q output falls, the PCLK signal also falls (delayed by some amount through the AND gate 304) based on the Q output as indicated by the arrow 406. Additionally, the npclk signal 312 rises to a high value (after some delay through the inverter 306). As described above, the pulse width (pwidth) of the PCLK signal is based on the rising edge of the CLK signal and the falling edge of the Q signal. Accordingly, the pulse width of the PCLK signal is based on the time for low data to go through the D latch 302.

When the CLK signal falls, the D latch 302 is set. With the Q output of the D latch 302 high and the CLK signal low, the PCLK signal is low (and the npclk signal 312 is high). The pulse generator circuit 300 is back in its initial state.

Figure 5:
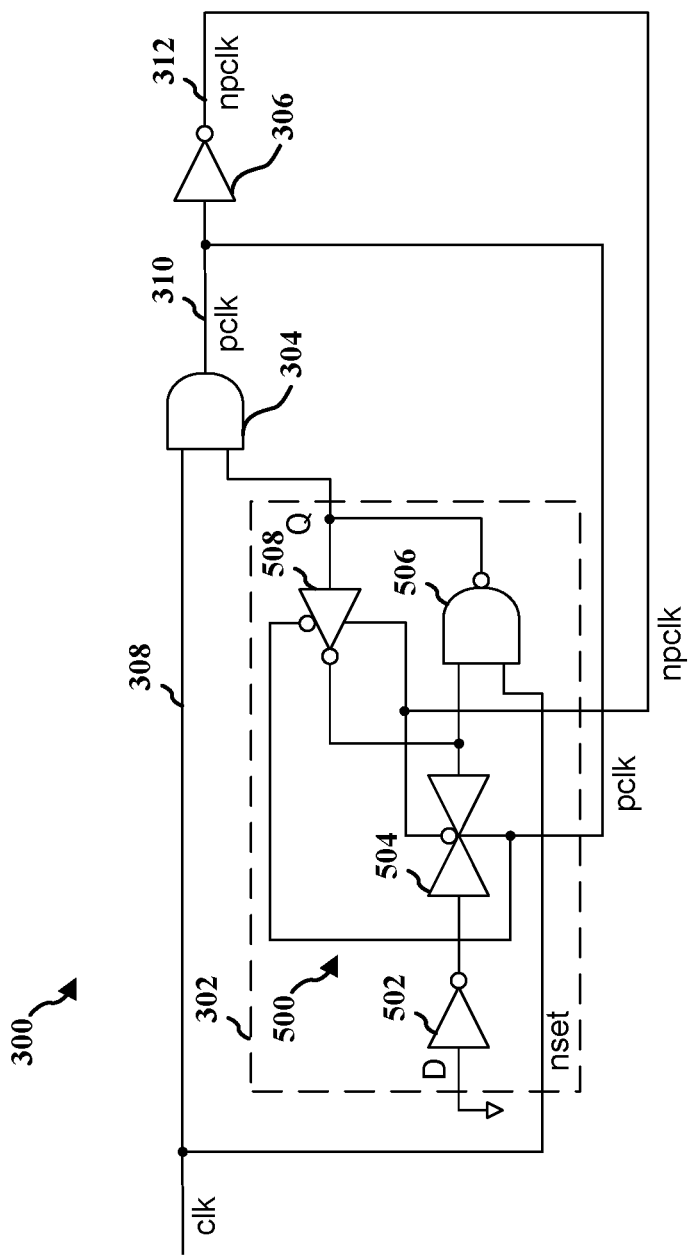
FIG. 5 is a circuit diagram illustrating an example of the pulse generator circuit of FIG. 3 in accordance with the systems and methods described herein.

FIG. 5 is a circuit diagram illustrating an example of the pulse generator circuit of FIG. 3 in accordance with the systems and methods described herein. FIG. 5 illustrates one example D latch circuit 500. The example of FIG. 5 is not intended to illustrate the only example D latch circuit that may be used. The example D latch circuit 500 includes an inverter 502, transmission gate 504, NAND gate 506, and tri-state inverter 508 which are connected to implement the following truth table:

| pclk/npclk | D | Qprev | Qnext | Comment |
|---|---|---|---|---|
| 0/1 | X | Q | Q | No change |
| 1/0 | 0 | X | 0 | Reset |
| 1/0 | 1 | X | 1 | Set |

When pclk/npclk are not active (pclk=0/npclk=1) the input does not pass through the transmission gate, and the output Q is held by feeding the output back to the NAND gate 506 through the tri-state inverter 508. Conversely, when pclk/npclk are active (pclk=1/npclk=0) the input passes through the transmission gate and the NAND gate 506 to the output Q and the tri-state inverter 508 does not drive the NAND gate 506.

Figure 6:
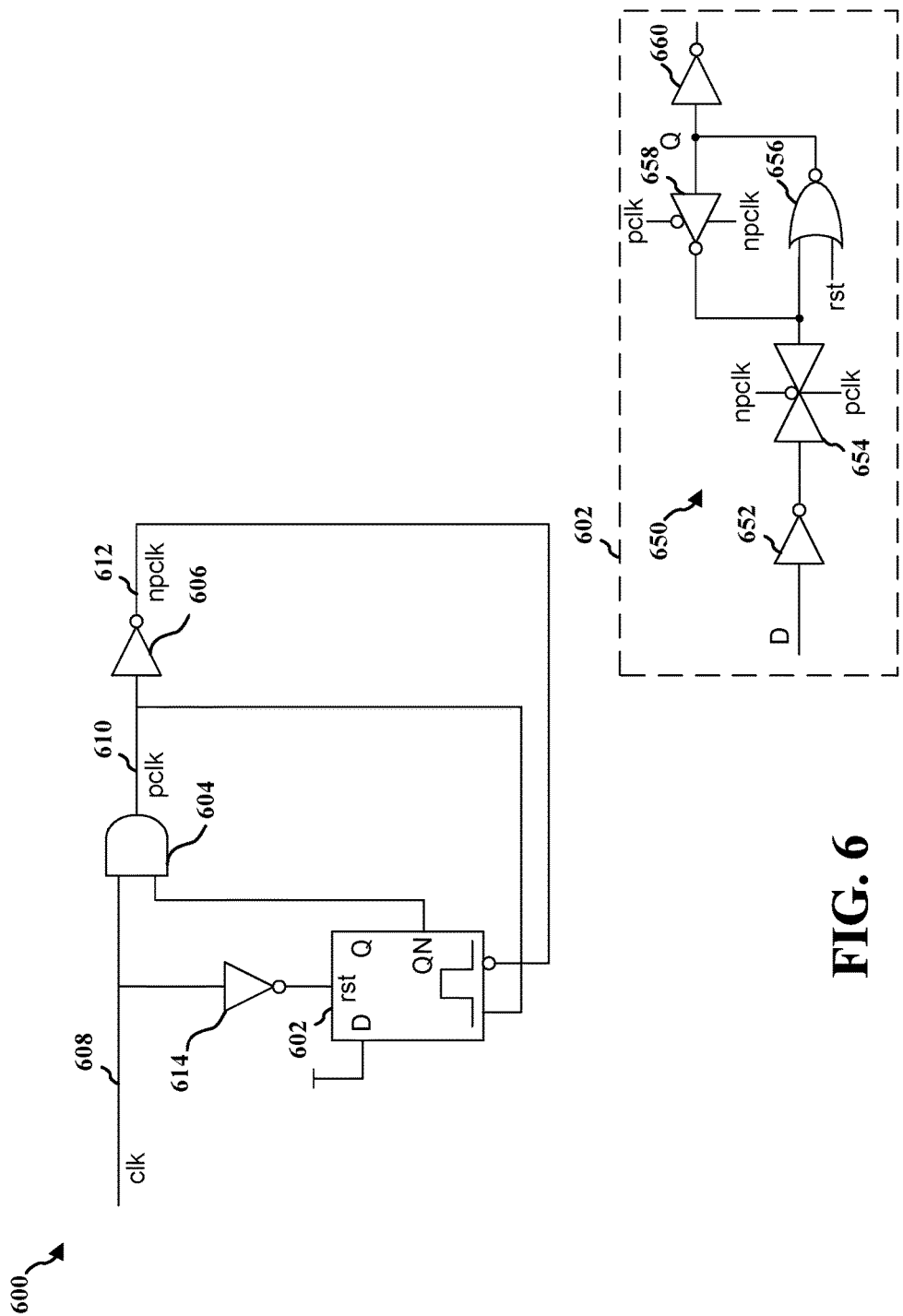
FIG. 6 is a circuit diagram illustrating another example of a pulse generator circuit in accordance with the systems and methods described herein.

FIG. 6 is a circuit diagram illustrating another example of a pulse generator circuit in accordance with the systems and methods described herein. The pulse generator circuit 600 of FIG. 6 includes a D latch 602, an AND gate 604, an inverter 606, and an inverter 614. The D latch 602 is driven by a pclk signal 610 and an npclk signal 612. The pclk signal 610 and the npclk signal 612 are generally the inverse of each other, e.g., the pclk signal 610 is an input of inverter 606 and the npclk signal 612 is an output of the inverter 606. Additionally, the pclk signal 610 and the npclk signal 612 may generally be the same pclk signal 610 and the same npclk signal 612 that are used to drive other D latches (not shown) used in the design. In the example of FIG. 6, the actual write path of the D latch is tied to high, i.e., D=1. Accordingly, the D latch 602 models a write-one operation, and can be referred to as a "write-one" D latch.

In operation, in an initial state, the clock (CLK) signal 608 is low. The pclk (PCLK) signal 610 is low in this initial state because a low value on either input of the AND gate 604 will cause the output of the AND gate 604 to be low. In the initial state, reset is active. As illustrated in FIG. 6, an inverted version of the clock signal 608 drives the rst input of the D latch 602. (The clock signal 608 is connected through inverter 614.) With reset active, the QN output of the D latch 302 is a logic high.

When the clock signal 608 rises, the reset signal is no longer active. The QN output of the D latch 602 remains high (until clocked low). Accordingly, as the clock signal 308/608 rises, the pclk signal 610 also rises (delayed by some amount through the AND gate 604). Additionally, the npclk signal 612 falls to a low value (after some delay through the inverter 606).

The rising edge of the pclk signal 610 and the falling edge of the npclk signal 612 clock the high value on the D input, which is tied high, into the D latch 602. Accordingly, the QN (the inverse of Q) output of the D latch 302 falls to a low value. Accordingly, as the QN output falls, the pclk signal 610 also falls (delayed by some amount through the AND gate 604). Additionally, the npclk signal 612 rises to a high value (after some delay through the inverter 606).

When the clock signal 608 falls, the D latch 602 is reset. With the QN output of the D latch 602 high and the clock signal low, the pclk signal 610 is low and the npclk signal 612 is high. The pulse generator circuit 600 is back in its initial state.

As described above, the pulse generator circuit 600 of FIG. 6 may generate a pulse signal (pclk 610) based on a clock signal 608. The pulse signal is initially low and rises with the rising edge of the clock signal 608 (plus any delay through the AND gate 604). The pulse signal falls based on the D input of the D latch 602, which is tied high. The D input of the D latch 302 is held high. After the clock signal 608 rises, the D input of the D latch 602 may be clocked into the D latch 602. This occurs on the edges of the pclk 610 and npclk signals 612. Accordingly, the pulse width (pwidth) is at least as long as the time needed for the high value to propagate through the D latch 602.

For the pulse generator circuit 600 of FIG. 6, the pulse width is based on the timing through the D latch 602 of a write-one operation. Any global shift in timing of the signals through the circuitry due to PVT (e.g., caused by weak PMOS/NMOS transistors) will be tracked in the pulse generator circuit 600 to adjust the pulse-width proportionately because the pulse generator circuit 600 uses the same type of latch (a D latch), clocked by the same pulses (pclk/npclk) as the functional latches in the device. Accordingly, the proper setup and hold times for the other D latches can generally be guaranteed because the other D latches are the same type of latch, may use the same type of process technology, and may generally be operating at the same or similar temperatures, as the D latch 602.

Additionally, the pulse generator circuit 600 accurately mimics the write-one operation of the functional latch for the clock (pclk) to output (Q) path (clk2q path) because the D input is tied high. Accordingly, the pulse generator circuit 600 always models a write-one operation. (FIGS. 3-5 relate to a write-one operation and FIGS. 8-9 cover both the write-zero operation and write-one operation.) Furthermore, variation of the clock drivers, if any, will be compensated for using the design of FIG. 6 because the pulse width of the pulses is primarily set by the D latch 602 rather than the Boolean logic, e.g., the AND gate 604 and the inverter 606.

FIG. 6 also illustrates one example D latch 602 implemented with circuitry 650, which includes an inverter 652, transmission gate 654, NOR gate 656, and tri-state inverter 658 which are connected to implement the D latch. When pclk/npclk are not active (pclk=0/npclk=1) the input does not pass through the transmission gate, and the output Q is held by feeding the output back to the NOR gate 656 through the tri-state inverter 658. Conversely, when pclk/npclk are active (pclk=1/npclk=0) the input passes through the transmission gate and the NOR gate 656 to the output Q and the tri-state inverter 658 does not drive the NOR gate 656. The output QN may be generated using an inverter 660 coupled to Q.

As discussed above, to ensure that the latch 104 of FIG. 1 receives a pulse clock (pclk) signal that has an acceptable pulse width, the pulse generator 220 of FIG. 2A uses the added buffers of the delay module 226. Use of the delay module 226 will generally result in higher hold-time, higher clock power, and increased area usage, however. The pulse generator circuit 600 of FIG. 6 does not generally need a delay module. Rather, the pulse generator circuit 600 of FIG. 6 generally ensures that the pulse width is acceptable because, in an example, the pulses for pclk and npclk are generated using the same type of latch (D latch) clocked by the same signals, i.e., the actual pclk and npclk signals, as will be used to clock the functional latches (e.g., the latch 104 of FIG. 1).

Figure 7:
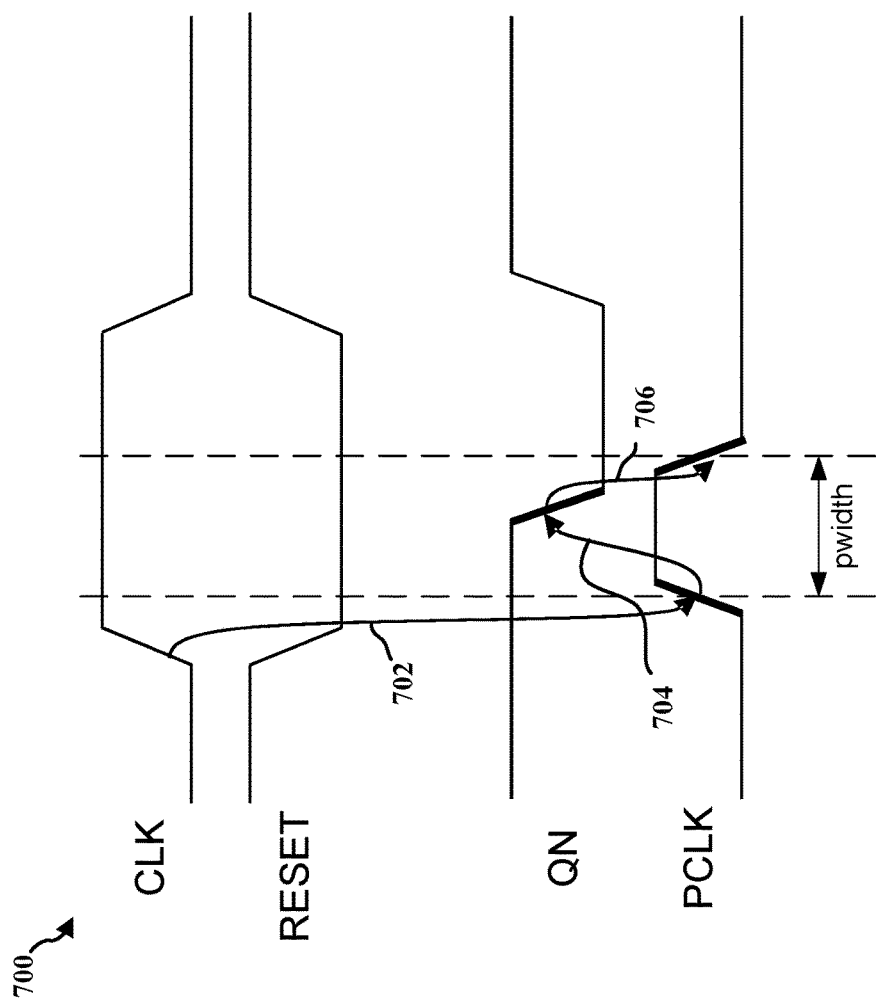
FIG. 7 is a timing diagram illustrating an example of signal timing related to the pulse generator circuit of FIG. 6.

FIG. 7 is a timing diagram 700 illustrating an example of signal timing related to the pulse generator circuit of FIG. 6. In an initial state, the CLK signal is low (clock signal 608). The PCLK signal (pclk 610) is low in this initial state because a low value on either input of the AND gate 604 will cause the output of the AND gate 604 to be low. In the initial state, RESET is active. An inverted version of the CLK signal (RESET) drives the rst input of the D latch 602. With RESET active, the QN output of the D latch 602 is a logic high.

When the CLK signal rises, the RESET signal is no longer active. The QN output of the D latch 602 remains high (until clocked low). Accordingly, as the CLK signal rises, the pclk signal 610 also rises (delayed by some amount through the AND gate 604) as indicated by the arrow 702. Additionally, the npclk signal 612 (not shown), which is the inverse of the pclk signal 610/PCLK falls to a low value (after some delay through the inverter 606).

The rising edge of the PCLK signal and the falling edge of the npclk signal 612 clock the high value on the D input, which is tied high, into the D latch 602. Accordingly, the QN output of the D latch 602 falls to a low value based on the rising edge of the PCLK signal as indicated by the arrow 704. As the QN output falls, the PCLK signal also falls (delayed by some amount through the AND gate 604) based on the QN output as indicated by the arrow 706. As described above, the pulse width (pwidth) of the PCLK signal is based on the rising edge of the CLK signal and the falling edge of the QN signal. Accordingly, the pulse width of the PCLK signal is based on the time for high data to go through the D latch 602. Additionally, the npclk signal 612 rises to a high value (after some delay through the inverter 606).

When the CLK signal falls, the D latch 602 is reset. (The RESET signal rises.) With the QN output of the D latch 602 high and the CLK signal low, the PCLK signal is low (and the npclk signal 612 is high). The pulse generator circuit 600 is back in its initial state.

Figure 8:
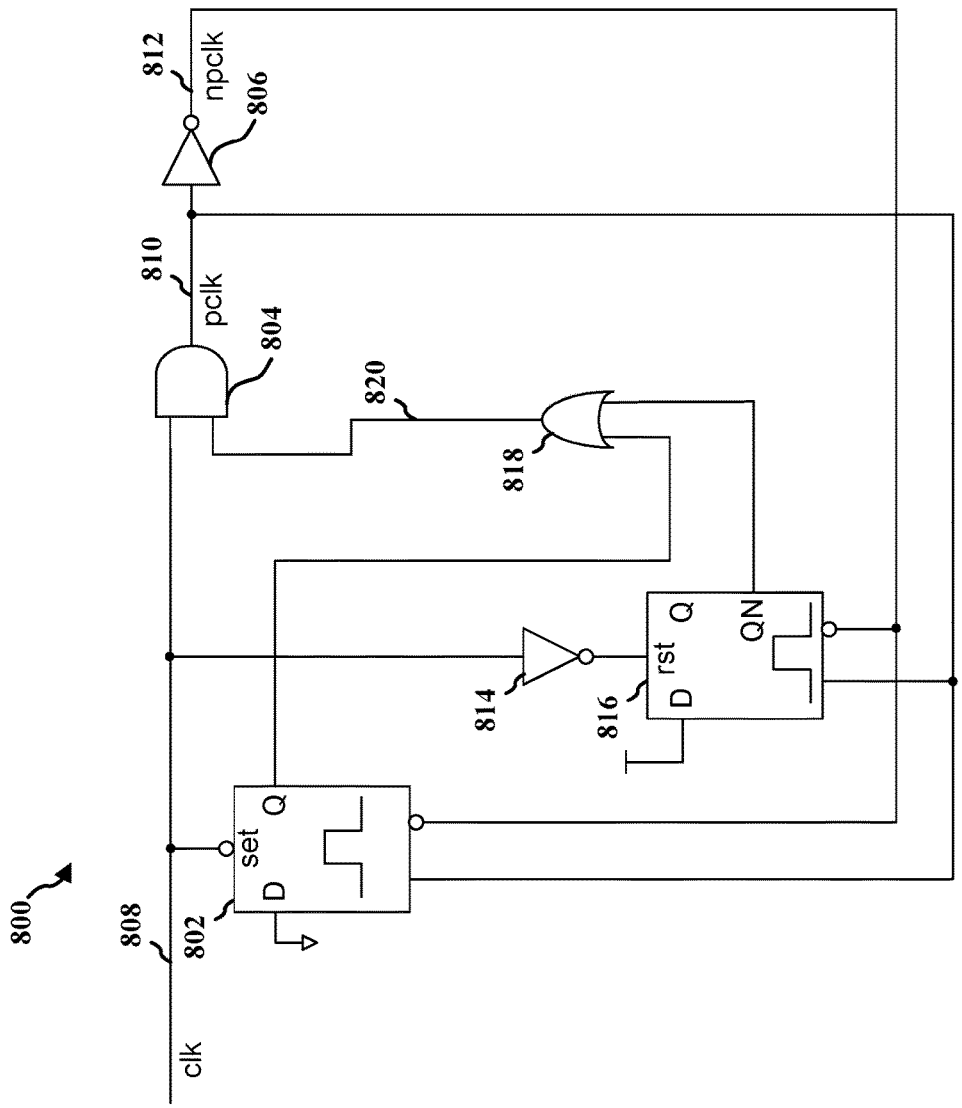
FIG. 8 is a circuit diagram illustrating another example of a pulse generator circuit in accordance with the systems and methods described herein.

FIG. 8 is a circuit diagram illustrating another example of a pulse generator circuit 800 in accordance with the systems and methods described herein. The pulse generator circuit 800 of FIG. 8 includes a D latch 802, an AND gate 804, an inverter 806, an inverter 814, a D latch 816, and an OR gate 818. The pulse generator circuit 800 of FIG. 8 includes a write-zero D latch 802 and a write-one D latch 816. The outputs of the write-zero D latch 802 and the write-one D latch 816 are combined using the OR gate 818 to produce a combined signal 820 that is input to the AND gate 804 to generate the pclk signal 810, which is input to the inverter 806 to produce the npclk signal 812.

The operation of the write-zero D latch 802 is generally the same as the operation of the write-zero D latch 302 of FIG. 3. The operation of the write-one D latch 816 is generally the same as the operation of the write-one D latch 602 of FIG. 6. The outputs of the write-zero D latch 802 and the write-one D latch are combined using the OR gate 818. The function of the AND gate 804 and the inverter 806 is generally the same as the function of the AND gate 304 and the inverter 306 and the function of the AND gate 604 and the inverter 606, except that the inputs to the AND gate 304, 604 from the write-zero D latch 302 of FIG. 3 or the write-one D latch 602 of FIG. 6, respectively, are replaced by the combined outputs the write-zero D latch 802 and the write-one D latch combined using the OR gate 818

By combining the write-zero D latch 802 output (Q) and the write-one D latch 816 output (QN) the timing of both the write-zero operation and the write operation may be accounted for in the generation of the pclk 810 and npclk signals. For example, if one generation technique, i.e., write-zero or write-one is longer, pclk 810/npclk 812 will be longer. In some examples, one signal may propagate through a D latch faster than another. Accordingly, the pclk 810 signal and the npclk 812 signal may be held based on the slower of the two signals from the D latches (Q/QN).

Figure 9:
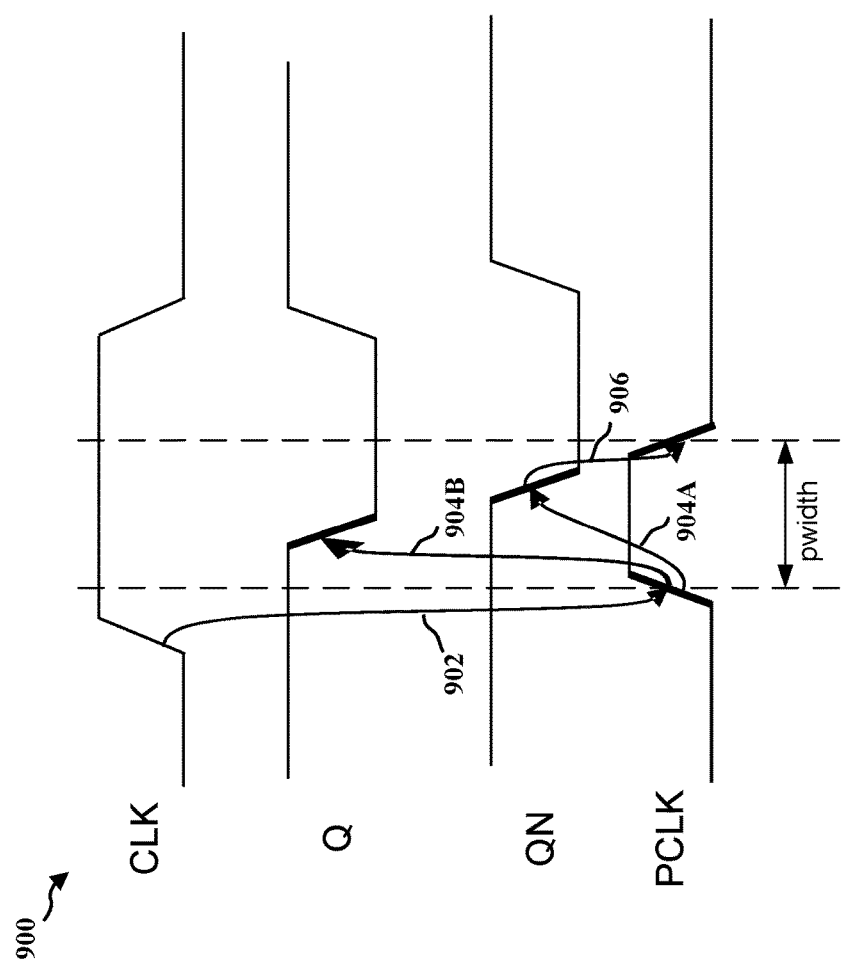
FIG. 9 is a timing diagram illustrating an example of signal timing related to the pulse generator circuit of FIG. 8.

FIG. 9 is a timing diagram 900 illustrating an example of signal timing related to the pulse generator circuit of FIG. 8. Two outputs from the D latches 802, 816, Q from D latch 802 and QN from D latch 816, are illustrated in FIG. 9. Additionally, as illustrated in FIG. 9, the generation of Q and QN might not have the same timing. Accordingly, because Q and QN are combined together using the OR gate 818 of FIG. 8 as part of the generation of the PCLK signal, the pulse width (pwidth) of PCLK may be increased. As illustrated by the arrow 902 in FIG. 9, PCLK rises based on the rising edge of the CLK signal. The falling edge of the PCLK signal may be based on the later of the falling edge of the Q signal or the falling edge of the QN signal. The falling edge of the Q signal and the QN signal may both be based on the rising edge of the PCLK signal, as indicated by the arrows 904A, 904B, however, the timing through the write-zero latch 802 and the timing through the write-one latch 816 may be different. The timing through the individual latches 802, 816 themselves may be different, however, generally it may be assumed that the majority of the timing difference may be due to differences in timing for the write-zero operation and for the write-one operation (in the example). In the illustrated example of FIG. 9, the falling edge of the QN signal is after the falling edge of the Q signal (however, it will be understood that the Q signal could have the later falling edge in other examples). Accordingly, in the illustrated example of FIG. 9, the PCLK signal falling edge is based on the falling edge of QN as indicated by the arrow 906. Accordingly, the pulse width (pwidth) of the PCLK signal is based on the rising edge of the CLK signal and the latest falling edge of the Q signal or the QN signal. Accordingly, the pulse width of the PCLK signal is based on the longer of the time for low data or high data to go through one of the D latch 802 or the D latch 816 respectively. Generally, any delay difference between the D latch 802 and the D latch 816 may be from differences between the write-zero path and the write-one path. However, in some cases other variations between different latches may come into play in terms of impacting the delay through the latch, e.g., 802, 816. (In some cases, different latches might not ever have the exact same timing characteristics, but in many cases, they may be quite similar for the same die and the same PVT.) As further illustrated in FIG. 9, the npclk signal 812 rises to a high value (after some delay through the inverter 806).

Referring back to FIGS. 3, 6, and 8, a pulse generation circuit (300, 600, 800) may include a first latch (302, 602, 802, 816) configured to store a first state or a second state. The first latch (302, 602, 802, 816) may have a first latch input, one of a set input or a reset input, a first pulse clock input, and a first latch output. The first latch input may be coupled to a fixed logic value (e.g., logic zero or logic one). Additionally, the one of the set input or the reset input may be coupled to a clock signal (308, 608, 808) or an inverted clock signal, respectively.

The pulse generation circuit (300, 600, 800) may further have an AND gate (304, 604, 804) having a first AND gate input, a second AND gate input, and a first AND gate output. The clock signal (308, 608, 808) may be coupled to the first AND gate input. The first latch output may be coupled to the second AND gate input. The AND gate output may be configured to output a pulsed clock (pclk). The pulsed clock may be coupled to the first pulse clock input.

In one example, the first latch (302, 802) may include a transmission gate (504) gated by the pulse clock and an inverted pulse clock. The transmission gate (504) may have a transmission gate input and a transmission gate output. Additionally, the transmission gate input may be coupled to the first inverter (502) output.

In another example, the fixed logic value is a logical low and the first latch (302, 802) has the set input coupled to the clock signal. In some examples, the first latch (302, 802) may be coupled to an inverter (306, 806) through an AND gate (304, 804). The inverter (306, 806) has an inverter input and an inverter output. The inverter input may be coupled to an output of the AND gate (304, 804). The inverter output may be coupled to an active low pulse input to the first latch (302, 802) and the latch (816).

In some examples, the first latch (302, 802) may include a NAND gate (506) having a first NAND gate input, a second NAND gate input, and a NAND gate output. The first NAND gate input may be coupled to the transmission gate output. The second NAND gate input may be coupled to the set input. The NAND gate output may be the first latch output.

In some examples, the first latch (302, 802) may include a tri-state inverter (508) having a tri-state inverter input and a tri-state inverter output. The tri-state inverter (508) may be gated by the pulse clock and an inverted pulse clock. The NAND gate output may be coupled to the tri-state inverter input. Additionally, the tri-state inverter output may be coupled to the first NAND gate input.

In some examples, the fixed logic value is a logical high and the first latch (602, 816) has the reset input coupled to the inverted clock signal. In some examples, the first latch (602, 816) may include a first inverter (652) having a first inverter input and a first inverter output. The first latch (602, 816) may include a transmission gate (654) gated by the pulse clock and an inverted pulse clock. The transmission gate (654) may have a transmission gate input and a transmission gate output. The transmission gate input may be coupled to the first inverter output.

In some examples, the first latch (602, 816) may include a NOR gate (656) having a first NOR gate input, a second NOR gate input, and a NOR gate output. The first NOR gate input may be coupled to the transmission gate output. The second NOR gate input may be coupled to the reset input.

In some examples, the first latch (602, 816) may include a second inverter (660) having a second inverter input and a second inverter output. The second inverter input may be coupled to the NOR gate output. The second inverter output may be the first latch output (QN).

In some examples, the first latch (602, 816) may include a tri-state inverter (658) having a tri-state inverter input and a tri-state inverter output. The tri-state inverter may be gated by the pulse clock and an inverted pulse clock. The NOR gate output may be coupled to the tri-state inverter input. The tri-state inverter output may be coupled to the first NOR gate input.

In some examples, pulse generation circuit (300, 600, 800) may include an inverter (306, 606, 806) having an inverter input and an inverter output. The inverter input may be coupled to the AND gate output. The inverter output may be an inverted pulse clock. The first latch (302, 602, 802) may have a first inverted pulse clock input coupled to the inverted pulse clock. In an example, the fixed logic value may be a logical low. Additionally, the first latch (302, 602, 802) may have the set input coupled to the clock signal (308, 608, 808). The pulse generator circuit (800) may further include a second latch (816) configured to store the first state or the second state. The second latch may have a second latch input, a reset input, a second pulse clock input, and a second latch output. The second latch input may be coupled to a logic high. The reset input (rst) may be coupled to an inverted clock signal.

In some examples, pulse generation circuit (800) may include an OR gate 818 having a first OR gate input, a second OR gate input, and an OR gate output. The first latch output being coupled to the second AND gate input through the OR gate, the second latch output being coupled to the second AND gate input through the OR gate. The first latch output may be coupled to the first OR gate input. The second latch output may be coupled to the second OR gate input. Additionally, the OR gate output may be coupled to the second AND gate input.

In some examples, pulse generation circuit (800) the first latch (802) has a first inverted pulse clock input and the second latch (816) has a second inverted pulse clock input. The pulse generator (800) may further include an inverter (806) having an inverter input and an inverter output. The AND gate output may be coupled to the inverter input. The inverter output may be an inverted pulse clock (npclk). The inverter output may be coupled to the first inverted pulse clock input and the second inverted pulse clock input.

Some example pulse generators may include means for generating an edge of a pulse based on an edge of a clock signal. The means for generating an edge of a pulse based on an edge of a clock signal may include an AND gate 304, 604, 804 as well as other circuitry, such as, for example, an inverter 306, 606, 806.

Some example pulse generators may include means for maintaining the pulse at the logical value after the edge based on a propagation of a signal through a circuit. The means for maintaining the pulse at the logical value after the edge based on a propagation of a signal through a circuit may include a D latch 302, 602, 802, 816.

Some example pulse generators may include means for clocking the second latch using the pulse generated. The means for clocking the second latch using the pulse generated may include the pclk signal 310, 610, 810 and the npclk signal 312, 612, 812 generated by pulse generator circuit 300, 600, 800, respectively.

Some example pulse generators may include means for generating an edge of a second pulse based on the edge of a clock signal. The means for generating an edge of a second pulse based on an edge of a clock signal may include an AND gate 304, 604, 804 as well as other circuitry, such as, for example, an inverter 306, 606, 806.

Some example pulse generators may include means for maintaining the second pulse at the logical value after the edge based on a propagation of a signal through a second circuit. The means for maintaining the second pulse at the logical value after the edge based on a propagation of a signal through a circuit may include a D latch 302, 602, 802, 816.

Some example pulse generators may include means for combining the pulse and the second pulse to generate an output pulse. The means for combining the pulse and the second pulse to generate an output pulse may include the OR gate 818.

Some example pulse generators may include means for clocking a latch with the output pulse. The means for clocking the latch using the pulse generated may include the pclk signal 310, 610, 810 and the npclk signal 312, 612, 812 generated by pulse generator circuit 300, 600, 800, respectively.

Figure 10:
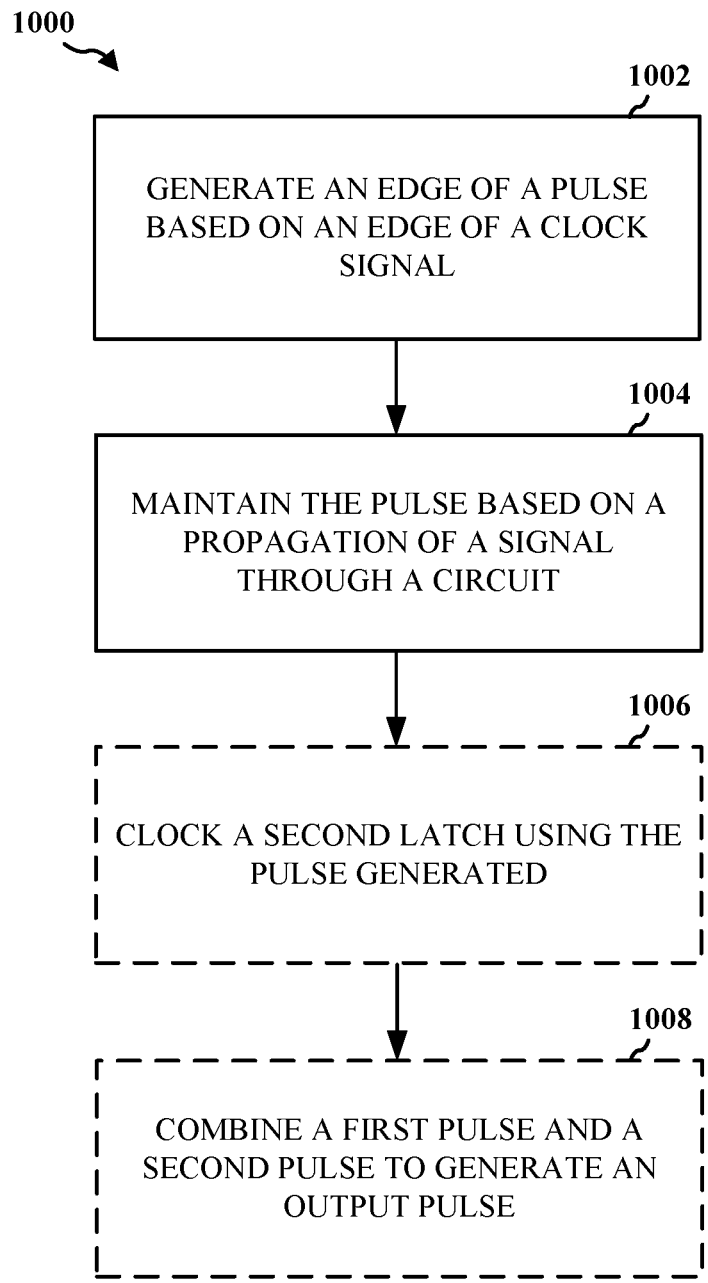
FIG. 10 is a flowchart of one example of a method of pulse generation.

FIG. 10 is a flowchart 1000 of one example of a method of pulse generation. The method may be performed by a pulse generator circuit 300, 600, 800. At block 1002, the pulse generator circuit 300, 600, 800 generates an edge of a pulse based on an edge of a clock signal. The pulse has a logical value after the edge. For example, The AND gate 304, 604, 804 as well as other circuitry, such as, for example, the inverter 306, 606, 806 may generate an edge of a pulse based on an edge of a clock signal. In some examples, the edge of the pulse may be a rising edge and the logical value of the pulse after the rising edge may be a logical high value. For example, the edge of the clock signal may be a rising edge of the clock signal. The edge of the pulse may be based on the rising edge of the clock signal.

At block 1004, the pulse generator circuit 300, 600, 800 maintains the pulse at the logical value after the edge based on a propagation of a signal through a circuit. The circuitry for maintaining the pulse at the logical value after the edge based on a propagation of a signal through a circuit may include the D latch 302, 602, 802, 816. In some examples, the circuit is a type of circuit that is being clocked by the pulse, e.g., a D latch 302, 602, 802, 816. In some examples, maintaining the pulse at the logical value after the edge based on a propagation of a signal through a circuit includes generating a falling edge of the pulse based on an output of a first latch.

At block 1006, the pulse generator circuit 300, 600, 800 clocks a second latch using the pulse generated. The second latch may be the same type of latch as the first latch. The circuitry for clocking the second latch using the pulse generated may include the pclk signal 310, 610, 810 and the npclk signal 312, 612, 812 generated by pulse generator circuit 300, 600, 800, respectively.

At block 1008, the pulse generator 800 combines a first pulse and a second pulse to generate an output pulse. For example, the OR gate 818 may combine a first pulse and a second as part of generating the output pulse. The AND gate 804 and the inverter 806 may further be used to generate one or more output signals, e.g., pclk 810 and npclk 812. The output signals pclk 810, and npclk 812 are based in part on the output of the OR gate 818, the combined signal 820. Additionally, the output signals pclk 810, and npclk 812 are based in part on the clock (CLK) signal 808.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A pulse generator comprising:
   a first latch configured to store a first state or a second state, the first latch having a first latch data input, one of a set input or a reset input, a first pulse clock input, and a first latch output, the first data latch input being coupled to a fixed logic value, wherein the fixed logic value is a logical low, and the first latch has the set input coupled to a clock signal, said one of the set input or the reset input being coupled to the clock signal or an inverted clock signal, respectively, the first latch comprising:
   a first inverter having a first inverter input and a first inverter output;
   a transmission gate gated by the pulse clock and an inverted pulse clock, the transmission gate having a transmission gate input and a transmission gate output, the transmission gate input being coupled to the first inverter output;
   a NAND gate having a first NAND gate input, a second NAND gate input, and a NAND gate output, the first NAND gate input being coupled to the transmission gate output, the second NAND gate input being coupled to the set input, the NAND gate output being the first latch output; and
   a tri-state inverter having a tri-state inverter input and a tri-state inverter output, the tri-state inverter being gated by the pulse clock and the inverted pulse clock, the NAND gate output being coupled to the tri-state inverter input, the tri-state inverter output being coupled to the first NAND gate input; and
   an AND gate having a first AND gate input, a second AND gate input, and a first AND gate output, the clock signal being coupled to the first AND gate input, the first latch output being coupled to the second AND gate input, the AND gate output being configured to output a pulsed clock, the pulsed clock being coupled to the first pulse clock input.

2. The pulse generator of claim 1, further comprising an inverter having an inverter input and an inverter output, the inverter input being coupled to the AND gate output, the inverter output being the inverted pulse clock.

3. The pulse generator of claim 2, wherein the first latch has a first inverted pulse clock input coupled to the inverted pulse clock.

4. A method of pulse generation comprising:
   generating an edge of a pulse based on an edge of a clock signal, the pulse having a logical value after the edge; and
   maintaining the pulse at the logical value after the edge based on a propagation of a signal through a circuit, wherein the circuit is a type of circuit that is being clocked by the pulse, and wherein maintaining the pulse at the logical value after the edge based on the propagation of the signal through the circuit includes sampling a fixed logic value on a data input of a latch of the circuit and providing feedback within the circuit through a NAND gate and a tri-state inverter, the circuit including the NAND gate and the tri-state inverter.

5. The method of claim 4, wherein the edge of the pulse comprises a rising edge and the logical value of the pulse after the rising edge comprises a logical high value.

6. The method of claim 5, wherein the edge of the clock signal comprises a rising edge of the clock signal, the edge of the pulse based on the rising edge of the clock signal.

7. The method of claim 6, wherein maintaining the pulse at the logical value after the edge based on the propagation of the signal through the circuit includes generating a falling edge of the pulse based on an output of a first latch.

8. A pulse generator comprising:
   means for generating an edge of a pulse based on an edge of a clock signal, the pulse having a logical value after the edge; and
   means for maintaining the pulse at the logical value after the edge based on a propagation of a signal through a circuit, and wherein the means for maintaining the pulse at the logical value after the edge based on the propagation of the signal through the circuit includes a first latch configured to store a first state or a second state of the signal, the first latch having a first data latch input, a set input, a first pulse clock input, and a first latch output, the first data latch input being coupled to a fixed logic value, the set input being coupled to the clock signal, the first latch further comprising:
   a first inverter having a first inverter input and a first inverter output;
   a transmission gate gated by a pulse clock and an inverted pulse clock, the transmission gate having a transmission gate input and a transmission gate output, the transmission gate input being coupled to the first inverter output;

a NAND gate having a first NAND gate input, a second NAND gate input, and a NAND gate output, the first NAND gate input being coupled to the transmission gate output, the second NAND gate input being coupled to the set input, the NAND gate output being the first latch output; and a tri-state inverter having a tri-state inverter input and a tri-state inverter output, the tri-state inverter being gated by the pulse clock and the inverted pulse clock, the NAND gate output being coupled to the tri-state inverter input, the tri-state inverter output being coupled to the first NAND gate input.

9. The pulse generator of claim 8, wherein the edge of the pulse comprises a rising edge and the logical value of the pulse after the rising edge comprises a logical high value.

10. The pulse generator of claim 9, wherein the edge of the clock signal comprises a rising edge of the clock signal, the edge of the pulse based on the rising edge of the clock signal.

11. The pulse generator of claim 10, wherein maintaining the pulse at the logical value after the edge based on the propagation of the signal through the circuit includes generating a falling edge of the pulse based on an output of a first latch.

12. The pulse generator of claim 8, wherein the means for generating an edge of a pulse based on an edge of a clock signal includes an AND gate having a first AND gate input, a second AND gate input, and a first AND gate output, the clock signal being coupled to the first AND gate input.

13. A pulse generator comprising:
a first circuit configured to generate an edge of a pulse based on an edge of a clock signal, the pulse having a logical value after the edge; and the first circuit further configured to maintain the pulse at the logical value after the edge based on a propagation of a signal through a circuit the circuit including the first circuit, the signal comprising a data signal propagating through the circuit, and wherein the first circuit includes an AND gate having a first AND gate input, a second AND gate input, and a first AND gate output, the clock signal being coupled to the first AND gate input and wherein the first circuit further includes a first latch configured to store a first state or a second state, the first latch having a first latch data input, a set input, a first pulse clock input, and a first latch output, the first latch data input being coupled to a fixed logic value, the set input being coupled to the clock signal, the first latch further comprising:

a first inverter having a first inverter input and a first inverter output;

a transmission gate gated by a pulse clock and an inverted pulse clock, the transmission gate having a transmission gate input and a transmission gate output, the transmission gate input being coupled to the first inverter output;

a NAND gate having a first NAND gate input, a second NAND gate input, and a NAND gate output, the first NAND gate input being coupled to the transmission gate output, the second NAND gate input being coupled to the set input, the NAND gate output being the first latch output; and a tri-state inverter having a tri-state inverter input and a tri-state inverter output, the tri-state inverter being gated by the pulse clock and the inverted pulse clock, the NAND gate output being coupled to the tri-state inverter input, the tri-state inverter output being coupled to the first NAND gate input.

14. The pulse generator of claim 13, wherein the edge of the pulse comprises a rising edge and the logical value of the pulse after the rising edge comprises a logical high value.

15. The pulse generator of claim 14, wherein the edge of the clock signal comprises a rising edge of the clock signal, the edge of the pulse based on the rising edge of the clock signal.

16. The pulse generator of claim 15, wherein maintaining the pulse at the logical value after the edge based on the propagation of the signal through the circuit includes generating a falling edge of the pulse based on an output of a first latch.

* * * * *